(12) United States Patent
Hori et al.

(10) Patent No.: US 11,261,091 B2
(45) Date of Patent: Mar. 1, 2022

(54) CARBON NANOSHEET AND MANUFACTURING METHOD THEREFOR

(71) Applicant: NATIONAL UNIVERSITY CORPORATION TOKAI NATIONAL HIGHER EDUCATION AND RESEARCH SYSTEM, Nagoya (JP)

(72) Inventors: Masaru Hori, Nagoya (JP); Hiroki Kondo, Nagoya (JP); Kenji Ishikawa, Nagoya (JP)

(73) Assignee: NATIONAL UNIVERSITY CORPORATION NAGOYA UNIVERSITY, Nagoya (JP)

( * ) Notice: Subject to any disclaimer, the term of this patent is extended or adjusted under 35 U.S.C. 154(b) by 8 days.

(21) Appl. No.: 16/957,890

(22) PCT Filed: Dec. 25, 2018

(86) PCT No.: PCT/JP2018/047640
§ 371 (c)(1),
(2) Date: Jun. 25, 2020

(87) PCT Pub. No.: WO2019/131667
PCT Pub. Date: Jul. 4, 2019

(65) Prior Publication Data
US 2021/0053830 A1    Feb. 25, 2021

(30) Foreign Application Priority Data

Dec. 25, 2017    (JP) .............................. JP2017-248408

(51) Int. Cl.
*C01B 32/15* (2017.01)
*C22C 1/10* (2006.01)
(Continued)

(52) U.S. Cl.
CPC .............. *C01B 32/15* (2017.08); *C01B 32/05* (2017.08); *C22C 1/1026* (2013.01); *B82Y 30/00* (2013.01);
(Continued)

(58) Field of Classification Search
CPC ....... C01B 32/15; C01B 32/05; C01B 32/182; C01B 32/198; C01B 2204/00;
(Continued)

(56) References Cited

U.S. PATENT DOCUMENTS

2011/0114499 A1 * 5/2011 Hori ...................... C01B 32/184
205/341

FOREIGN PATENT DOCUMENTS

JP    2012-218949 A    11/2012

OTHER PUBLICATIONS

Hagino, et al., Ultrahigh-Speed Synthesis of Nanographene Using Alcohol In-Liquid Plasma, Appl. Phys. Express 2012; 5: 035101-1 to 035101-1 (Year: 2012).*
(Continued)

*Primary Examiner* — Daniel C. McCracken
(74) *Attorney, Agent, or Firm* — Oliff PLC

(57) ABSTRACT

A carbon nanosheet, which is a sheet-form carbon nanomaterial having a larger area as compared with that of a similar conventional product and a side length of about 1 μm, and a method for producing the carbon nanosheet. The carbon nanosheet production method includes a step of mixing a solution of an iron atom-containing compound dispersed in a solvent with an alcohol, to thereby prepare a solution mixture; and a step of irradiating the solution mixture with plasma, to thereby produce a carbon nanosheet. The carbon nanosheet has a side length of 0.5 μm to 2.5 μm.

12 Claims, 11 Drawing Sheets

(51) Int. Cl.
  *C01B 32/05* (2017.01)
  *B82Y 30/00* (2011.01)
  *B82Y 40/00* (2011.01)
  *H05H 1/24* (2006.01)

(52) U.S. Cl.
  CPC .......... *B82Y 40/00* (2013.01); *C01P 2002/82* (2013.01); *C01P 2004/03* (2013.01); *C01P 2004/04* (2013.01); *C01P 2004/24* (2013.01); *H05H 1/2406* (2013.01)

(58) Field of Classification Search
  CPC ............ C01B 2204/02; C01B 2204/04; C01B 2204/06; C01B 2204/065; C01B 2204/20; C01B 2204/22; C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23; C22C 1/1026; B82Y 30/00; B82Y 40/00; C01P 2002/82; C01P 2004/03; C01P 2004/04; C01P 2004/24; C01P 2004/61; C01P 2004/62; H05H 1/2406; H05H 1/2431
  See application file for complete search history.

(56) References Cited

OTHER PUBLICATIONS

Senthilnathan, et al., Submerged liquid plasma—low energy synthesis of nitrogen-doped graphene for electrochemical applications, J. Mater. Chem. A 2014; 2: 3332-3337, with Supplemental Information (Year: 2014).*

Feb. 12, 2019 International Search Report issued in International Patent Application No. PCT/JP2018/047640.

* cited by examiner

1-Propanol+DMF+FePc

1-Butanol+DMF+FePc

Ethanol+DMF+$H_2$Pc

Ethanol +DMF

Ethanol

CARBON NANOSHEET AND MANUFACTURING METHOD THEREFOR

TECHNICAL FIELD

The technical field of the present specification pertains to a carbon nanosheet produced with plasma and to a production method therefor.

BACKGROUND ART

Techniques employing plasma are applied to electric, chemical, and material fields. Plasma provides electrons, cations, radicals with high chemical reactivity, and UV rays. A radical species is used in, for example, formation of film and etching of a semiconductor. A UV ray is used as, for example, a bactericidal or germicidal ray. Thus, a variety of plasma-mediated products expand the application range of plasma techniques.

One plasma technique is applied to formation of carbon material. For example, Patent Document 1 discloses a technique of synthesizing carbon nanotube through employment of plasma. More specifically, the technique disclosed in Patent Document 1 involves feeding a catalytic metal (e.g., nickel, cobalt, or iron) onto a substrate W1, to thereby form a carbide of the catalytic metal. According to the document, formation of carbon nanotube is initiated from the catalytic metal carbide.

PRIOR ART DOCUMENTS

Patent Documents

Patent Document 1: Japanese Patent Application Laid-Open (kokai) No. 2012-218949

SUMMARY OF THE INVENTION

Problems to be Solved by the Invention

The technique disclosed in Patent Document 1 enables production of a carbon nanotube, which is a tube-form carbon nanomaterial. However, the technique encounters difficulty in production of a sheet-form carbon nanomaterial of a large area having a side length of about 1 μm.

Under such circumstances, the present specification discloses a technique which has been established in order to solve the aforementioned problem involved in the conventional technique. Thus, an object of the present specification is to provide a method for producing a carbon nanosheet, which method can produce a sheet-form carbon nanomaterial having a larger area as compared with that of a similar conventional product and a side length of about 1 μm. Another object is to provide such a carbon nanosheet.

Means for Solving the Problems

In a first aspect of the present invention, there is provided a method for producing a carbon nanosheet, which method includes a step of mixing a solution of an iron atom-containing compound dispersed in a solvent with an alcohol, to thereby prepare a solution mixture; and a step of irradiating the solution mixture with plasma, to thereby produce a carbon nanosheet.

The carbon nanosheet production method realizes production of a sheet-form carbon nanomaterial. One side length of the carbon nanosheet is, for example, 0.5 μm to 2.5 μm, and the thickness of the carbon nanosheet is, for example, 0.7 nm to 10 nm.

Effects of the Invention

The present specification discloses a carbon nanosheet production method, which can produce a sheet-form carbon nanomaterial having a larger area as compared with that of a similar conventional product and a side length of about 1 μm, and such a carbon nanosheet.

MODES FOR CARRYING OUT THE INVENTION

Next will be described specific embodiments of the carbon nanosheet production method employing a plasma generator and the carbon nanosheet produced through the method.

First Embodiment

1. Carbon Nanosheet

Figure 1:
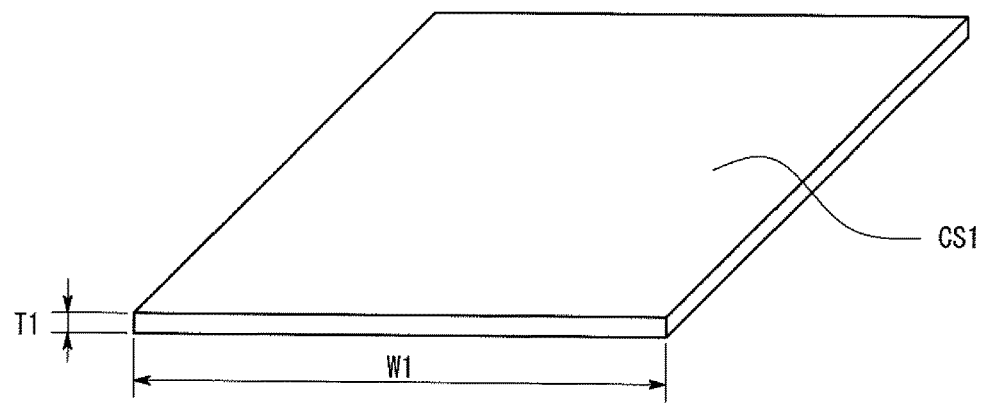
FIG. 1 Schematic structure of a carbon nanosheet of a first embodiment.

FIG. 1 schematically shows the structure of a carbon nanosheet CS1. As shown in FIG. 1, the carbon nanosheet CS1 is in the form of sheet. However, an actual carbon nanosheet product has a structure in which a plurality of carbon nanosheets CS1 are clustered.

The side length W1 of the carbon nanosheet CS1 is, for example, 0.5 μm to 2.5 μm. In some cases, a carbon nanosheet CS1 having a side length of 1 μm to 2 μm may be produced. The sheet thickness T1 of the carbon nanosheet CS1 is, for example, 0.7 nm to 10 nm. However, needless to say, a carbon nanosheet CS1 having a thickness falling outside the range may also be produced.

The carbon nanosheet CS1 contains iron atoms. As mentioned hereinbelow, the iron atoms originate from a raw material including iron atoms. Conceivably, the carbon nanosheet CS1 has an iron-nitrogen bond. As mentioned hereinbelow, the iron-nitrogen bond originates from a raw material having an iron-nitrogen bond. Also, the carbon nanosheet CS1 conceivably has a CN bond. As mentioned hereinbelow, CN radicals are generated under electric discharge.

2. Characteristics of Carbon Nanosheet

The carbon nanosheet CS1 exhibits an excellent catalytic activity for serving as a fuel cell catalyst. Therefore, the carbon nanosheet CS1 is a promising alternative for a platinum-based fuel cell catalyst. Details will be described in another section.

3. Plasma Generator

Figure 2:
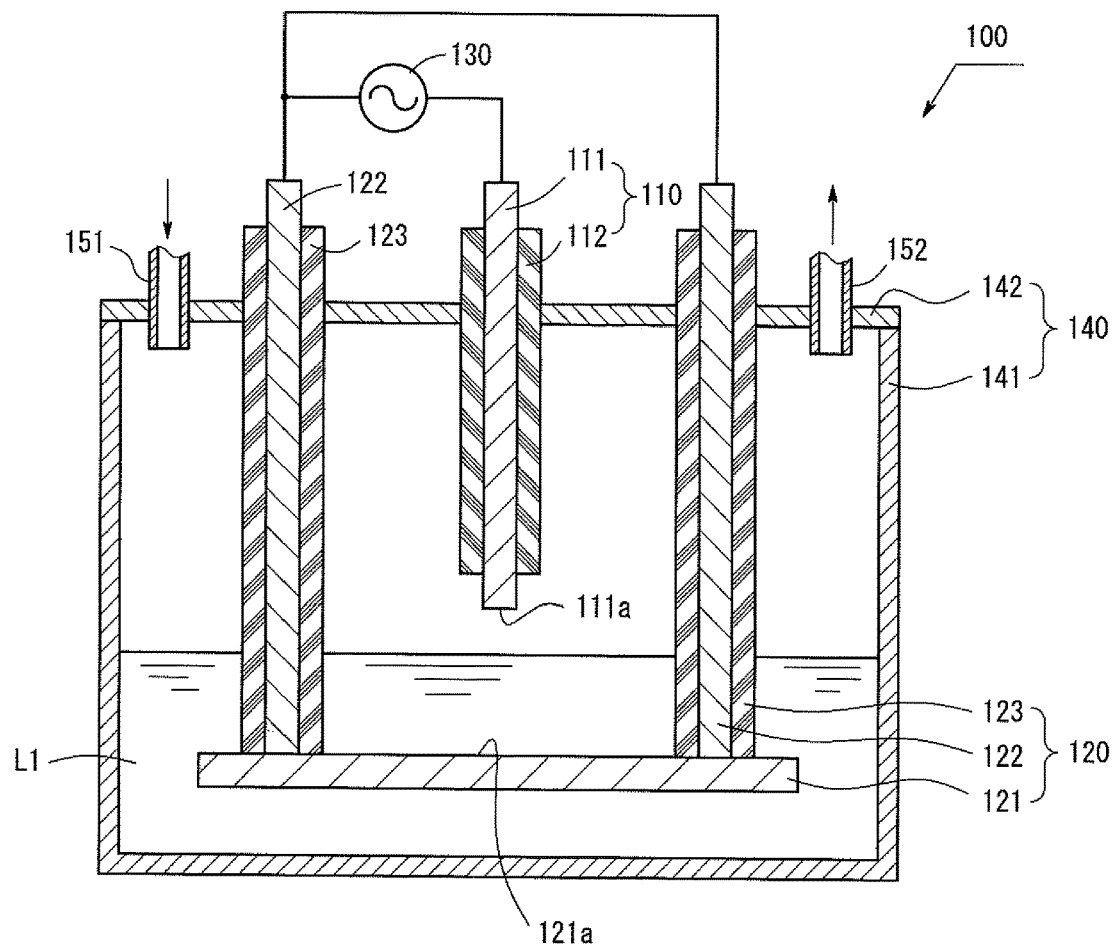
FIG. 2 Schematic structure of a plasma generator employed in the first embodiment.

FIG. 2 is a schematic structure of a plasma generator 100 employed in the first embodiment. The plasma generator 100 is employed for producing the carbon nanosheet CS1 shown in FIG. 1. The plasma generator 100 has a first electrode structure 110, a second electrode structure 120, a voltage-applying unit 130, a container 140, a gas supply inlet 151, and a gas discharge outlet 152.

The first electrode structure 110 has a first electrode 111 and an electrically insulating member 112. The first electrode 111 is a rod-shape electrode including an end portion 111a. The first electrode 111 is made of a material such as sintered graphite. Alternatively, the material of the first electrode 111 may be a metal or an alloy. The electrically insulating member 112 covers at least a portion of the first electrode 111 other than the end portion 111a. That is, the end portion 111a of the first electrode 111 is exposed without being covered with the electrically insulating member 112. Within the conductive portion of the first electrode structure 110, only the end portion 111a of the first electrode 111 is exposed to the inside of the container 140.

The second electrode structure 120 has a second electrode 121, an electrically conductive member 122, and an electrically insulating member 123. The second electrode 121 is a rod-shape electrode. The second electrode 121 has a lateral surface 121a which faces the end portion 111a of the first electrode 111. The second electrode 121 is made of a material such as sintered graphite. Alternatively, the material of the second electrode 121 may be a metal or an alloy. The electrically conductive member 122 is electrically connected to the second electrode 121. The material of the electrically conductive member 122 may be any of a carbon material, a metal, and an alloy. The electrically insulating member 123 covers the electrically conductive member 122. The second electrode 121 is exposed without being covered with the electrically insulating member 123. As a result, within the conductive portion of the second electrode structure 120, only the second electrode 121 is exposed to the inside of the container 140.

The voltage-applying unit 130 is adapted to apply a voltage between the first electrode 111 and the second electrode 121. The voltage is, for example, 9 kV, and the frequency is, for example, 60 Hz.

The container 140 is disposed so as to accommodate at least a part of the first electrode structure 110 and a part of the second electrode structure 120, and liquid L1. As mentioned hereinbelow, the liquid L1 is a solution mixture prepared by mixing a solution of an iron atom-containing compound dispersed in a solvent with an alcohol. The container 140 has a container body 141 and a lid 142.

The gas supply inlet 151 is adapted to supply gas into the inner space of the container 140. Thus, in a specific mode, the gas supply inlet 151 is connected to a gas cylinder storing argon or the like. Preferably, a mass flow controller or the like is disposed between the gas supply inlet 151 and the gas cylinder.

The gas discharge outlet 152 is adapted to discharge gas present in the inner space of the container 140. Thus, in a specific mode, the gas discharge outlet 152 may be connected to an exhauster such as a vacuum pump.

4. Discharging Electricity in Plasma Generator

As shown in FIG. 2, in operation, the liquid L1 is placed in the container body 141. The liquid L1 is supplied until the second electrode 121 is completely immersed in the liquid L1. At this timing, the first electrode 111 is opposed to the second electrode 121 via the liquid surface of liquid L1. The distance between the first electrode 111 and the liquid surface of the liquid L1 is, for example, 0.01 mm to 10 mm. The distance between the second electrode 121 and the liquid surface of liquid L1 is, for example, 0.01 mm to 20 mm. These values are given merely as standard examples, and other values may be acceptable.

Next, a voltage is applied between the first electrode 111 and the second electrode 121. During voltage application, electric discharge occurs between the end portion 111a of the first electrode 111 and the lateral surface 121a of the second electrode 121. More specifically, the electric discharge occurs between the uppermost (the nearest to the end portion 111a of the first electrode 111) portion of the lateral surface 121a of the second electrode 121 and the end portion 111a. Since the electrically conductive member 122 is covered with the electrically insulating member 123, electric discharge does not occur directly between the first electrode 111 and the electrically conductive member 122.

Notably, during electric discharge, lightning from the end portion 111a of the first electrode 111 reaches the lateral surface 121a of the second electrode 121.

5. Carbon Nanosheet Production Method

5-1. Solution Mixture Production Step

First, a solution of an iron atom-containing compound dispersed in a solvent is prepared. In this case, the iron atom-containing compound is an organic compound such as iron phthalocyanine. Iron phthalocyanine has an Fe—N bond but no Fe—C bond. That is, iron phthalocyanine is a metallorganic compound which has a metal-nitrogen bond but no metal-carbon bond.

The solvent is preferably an organic solvent, since organic solvents can sufficiently dissolve iron phthalocyanine or a similar compound and are highly compatible with alcohol. Examples of the solvent include N,N-dimethylformamide (DMF) and tetrahydrofuran (THF).

Subsequently, the thus-prepared solution is mixed with an alcohol, to thereby prepare a solution mixture. Examples of the alcohol include ethanol, propanol, and butanol. Needless to say, other alcohols may also be acceptable.

In the above-described step, the solution mixture is prepared by mixing an alcohol with a solution containing an iron atom-containing compound which is dispersed in a solvent.

The thus-prepared solution mixture is poured into the container body 141 of the container 140. Thus, the second electrode 121 is located in the solution mixture.

5-2. Plasma Radiation Step

Subsequently, argon is supplied through the gas supply inlet 151, and the gas present in the container 140 is discharged through the gas discharge outlet 152. The operation is continued until the argon gas concentration of the internal atmosphere of the container 140 increases to a sufficiently high level. Then, a voltage is applied between the first electrode 111 and the second electrode 121, whereby electric discharge occurs between the end portion 111a of the first electrode 111 and the lateral surface 121a of the second electrode 121.

Thus, the first embodiment employs the container 140 for accommodating the solution mixture, the first electrode 111 located in the gas phase, and the second electrode 121 placed in the solution mixture. Through application of a voltage between the first electrode 111 and the second electrode 121, electric discharge is caused to occur at the gas-liquid interface. While the interior of the container 140 is purged with noble gas, the solution mixture is irradiated with plasma. The plasma density during irradiation is $3\times10^{14}$ cm$^{-3}$ to $7\times10^{14}$ cm$^{-3}$. In the gas phase, CN radicals and CH radicals are generated. The amount of CH radicals is not significant.

Thus, in this step, the solution mixture is irradiated with plasma, to thereby produce a carbon nanosheet. The internal pressure of the container 140 may be an atmospheric or reduced pressure. As a result, a carbon nanosheet is formed in the solution mixture.

6. Role of Iron

6-1. Iron Atoms in the Solvent of the First Embodiment

The solution mixture contains a solution in which an iron atom-containing compound is dispersed. Conceivably, the iron atom present in the Fe-containing compound virtually serves as a catalyst in production of a carbon nanosheet.

6-2. Carbon Material and Iron in Prior Art

In some conventional techniques, iron serves as a catalyst in formation of a carbon material. For example, Patent Document 1 discloses a technique in which a carbon nanotube is formed from starting points of growth, which is iron serving as a catalytic metal. Needless to say, carbon nanotube is a tube-form carbon material. According to such a conventional technique, a tube-form carbon structure can be produced. However, difficulty is encountered in producing a sheet-form carbon structure of the first embodiment.

7. Effects of the First Embodiment

In the first embodiment, the sheet-form carbon nanosheet CS1 can be produced. The carbon nanosheet CS1 is a carbon material differing from a carbon nanotube.

In the case where at least one of the first electrode 111 and the second electrode 121 is made of a carbon material, carbon atoms may be transferred to the solution mixture. In the case where at least one of the first electrode 111 and the second electrode 121 is made of a metal or alloy, the metal or alloy may be transferred to the solution mixture.

When plasma is caused to generate at the gas-liquid interface, active species are generated in both the gas phase and the liquid phase. These active species may be used in the reaction for producing a carbon nanosheet. Generally, radicals originating from the gas (atmosphere gas) are generated in the gas phase, and radicals originating from the liquid (solution mixture) are generated in the liquid phase. In the first embodiment, both active species generated in the gas phase and those generated in the liquid phase may be used in the reaction. Since the interior of the container 140 has been purged with noble gas, substantially no active species derived from air are generated.

8. Modification

8-1. Iron Atom-Containing Compound

In the first embodiment, the iron atom-containing compound is, for example, iron phthalocyanine. Alternatively, the iron atom-containing compound may be hemin. Both iron phthalocyanine and hemin are organic compounds each containing an iron atom. Also, hemin has an Fe—N bond, but has no Fe—C bond. Therefore, when hemin is used, the carbon nanosheet CS1 may also be formed.

8-2. Plasma Gas

In the first embodiment, argon is supplied through the gas supply inlet 151. However, an oxygen-free gas other than argon may also be used. The oxygen-free gas other than argon is a gas having an oxygen gas content (by volume) of 1% or less. Examples of the gas include noble gases such as He and Ne, and nitrogen. In order to prevent reaction with the solution mixture, the gas supplied through the gas supply inlet 151 is preferably a noble gas.

8-3. Plasma Generator

A plasma apparatus other than the plasma generator 100 shown in FIG. 2 may also be employed.

8-4. Combination

Any combination of the aforementioned modifications may be employed.

EXAMPLES

Experiment 1

1. Plasma Apparatus

The plasma apparatus 100 shown in FIG. 2 was employed. The first electrode 111 was made of graphite and had a diameter of 3 mm. The first electrode 111 was located at a position 1 mm above the liquid surface of the solution mixture. The second electrode 121 was made of graphite. The second electrode 121 was located at a position 9 mm below the liquid surface of the solution mixture.

2. Solution Mixture

Solutions (including solution mixtures) shown in Table 1 were used. In Table 1, DMF denotes N,N-dimethylformamide, FePc denotes iron phthalocyanine, and H$_2$Pc denotes phthalocyanine.

In preparation of solution 1, iron phthalocyanine was dispersed in N,N-dimethylformamide, to thereby form a dispersion. The dispersion operation was carried out for 30 minutes by means of a homogenizer. To the dispersion (40 mL), an alcohol (160 mL) was added, to thereby form a solution mixture. The solution mixture was subjected to dispersion treatment for 10 minutes. Other solutions were produced in the same manner.

TABLE 1

| Solution | Alcohol | Additive |
| --- | --- | --- |
| Solution 1 | ethanol | DMF + FePc |
| Solution 2 | propanol | DMF + FePc |
| Solution 3 | butanol | DMF + FePc |

TABLE 1-continued

| Solution | Alcohol | Additive |
|---|---|---|
| Solution 4 | ethanol | DMF + H$_2$Pc |
| Solution 5 | ethanol | DMF |
| Solution 6 | ethanol | |

3. Method of Experiment

The solution mixture (200 mL) was put into the container body 141 of the container 140. Ar gas was supplied through the gas supply inlet 151 at a flow rate of 6 slm. Under the thus-provided conditions, a voltage was applied between the first electrode 111 and the second electrode 121 for 5 minutes. AC frequency was 60 Hz. Thereafter, the solution mixture was filtrated through a filtration membrane, to thereby recover a product (residue).

4. Results of Experiments 4-1. Visual Observation

Table 2 shows the results.

TABLE 2

| Solution | Alcohol | Additive | Sheet |
|---|---|---|---|
| Solution 1 | ethanol | DMF + FePc | ◯◯ |
| Solution 2 | propanol | DMF + FePc | ◯ |
| Solution 3 | butanol | DMF + FePc | ◯ |
| Solution 4 | ethanol | DMF + H$_2$Pc | X |
| Solution 5 | ethanol | DMF | X |
| Solution 6 | ethanol | | X |

Through irradiation of solution 1 with plasma, a residue containing sheet-like matter (side length: about 0.5 μm to about 2.5 μm) was yielded. Through irradiation of solution 2 or 3 with plasma, a residue containing sheet-like matter was yielded. The sheet-like matter was slightly smaller than that obtained from solution 1. Through irradiation of any one of solutions 4 to 6 with plasma, a residue was yielded. However, no sheet-like matter having a side length greater than 0.5 μm was identified in the residue through scanning electron microscopy. In all cases, the sheet-like matter was confirmed through visual observation.

4-2. Microscopy Image

Figure 3:
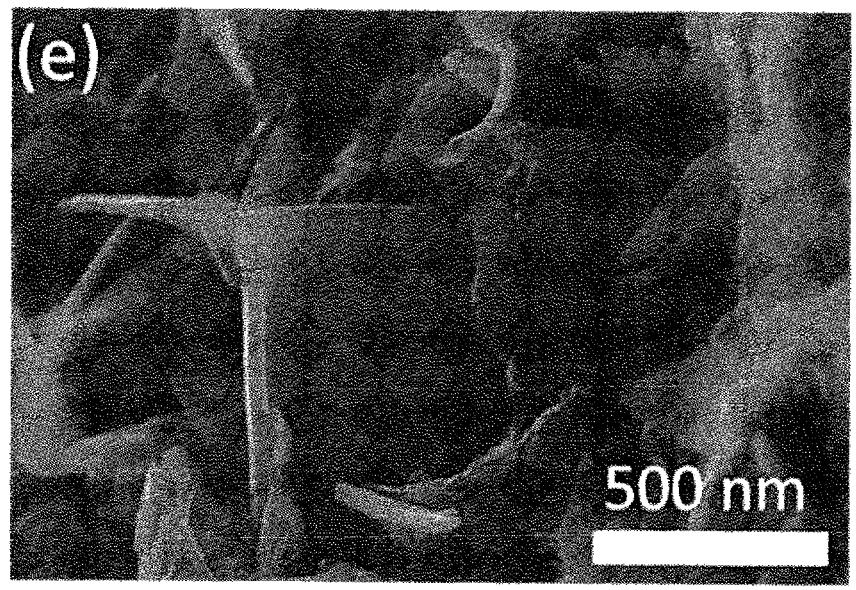
FIG. 3 A scanning electron microscopy image of the residue present in solution 1 after irradiation with plasma.
Figure 4:
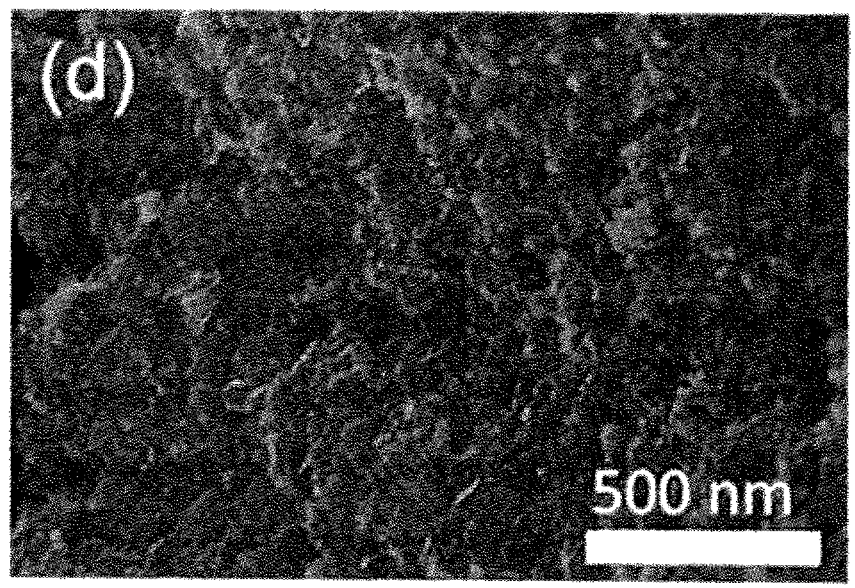
FIG. 4 A scanning electron microscopy image of the residue present in solution 2 after irradiation with plasma.
Figure 5:
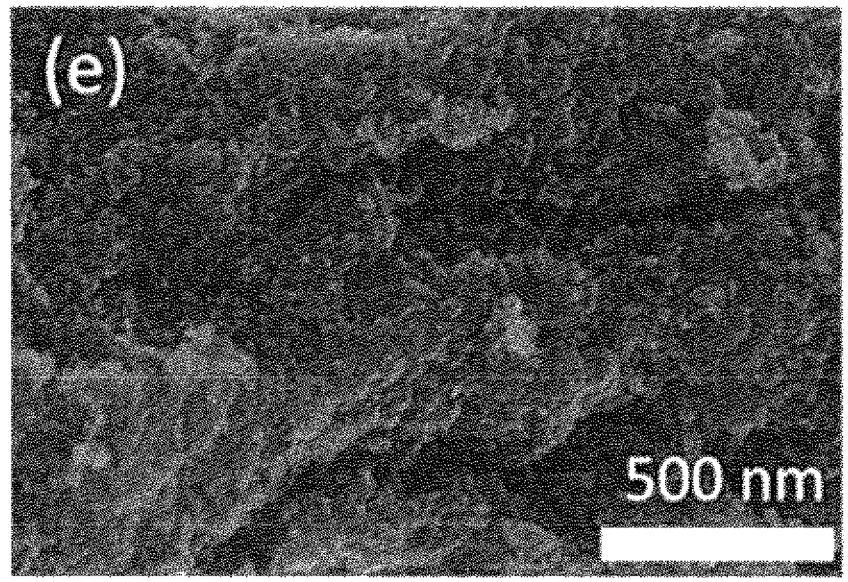
FIG. 5 A scanning electron microscopy image of the residue present in solution 3 after irradiation with plasma.
Figure 6:
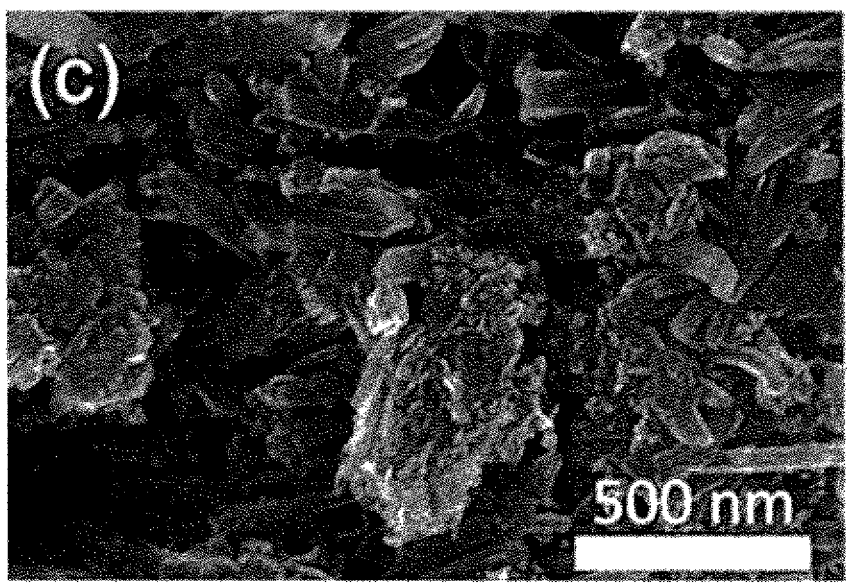
FIG. 6 A scanning electron microscopy image of the residue present in solution 4 after irradiation with plasma.
Figure 7:
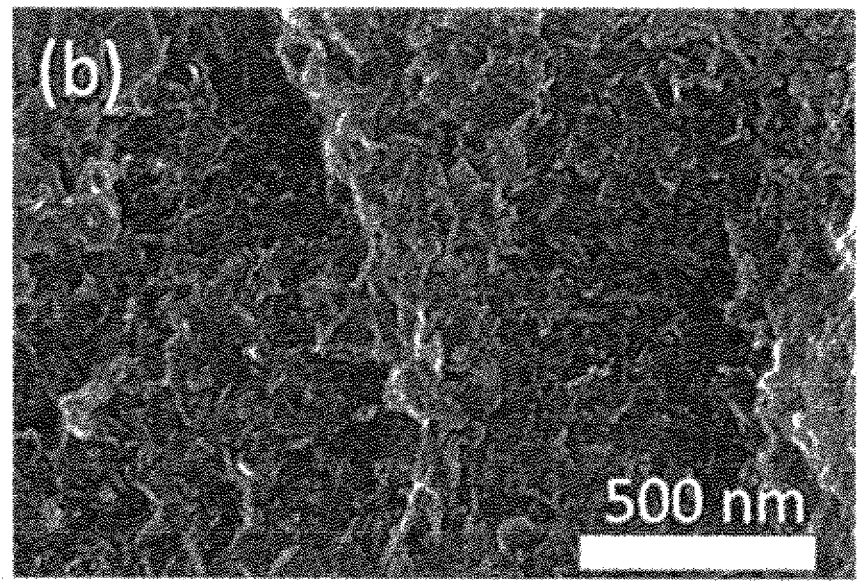
FIG. 7 A scanning electron microscopy image of the residue present in solution 5 after irradiation with plasma.
Figure 8:
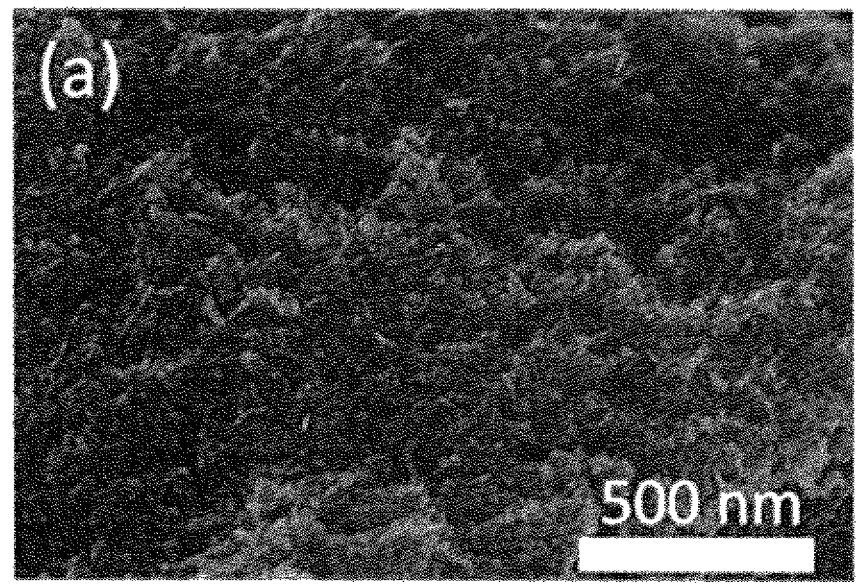
FIG. 8 A scanning electron microscopy image of the residue present in solution 6 after irradiation with plasma.
Figure 9:
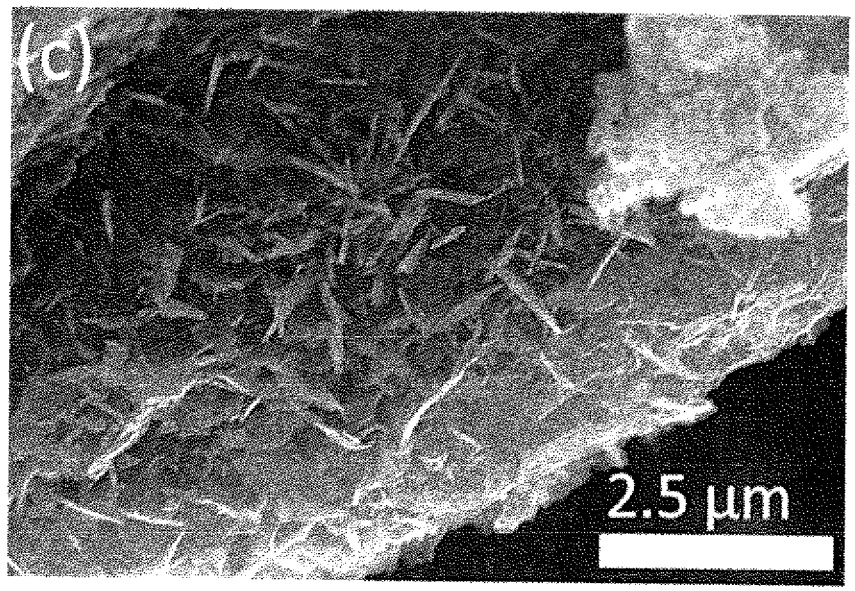
FIG. 9 A scanning electron microscopy image (enlarged view) of the sheet-form residue formed from solution 1.
Figure 10:
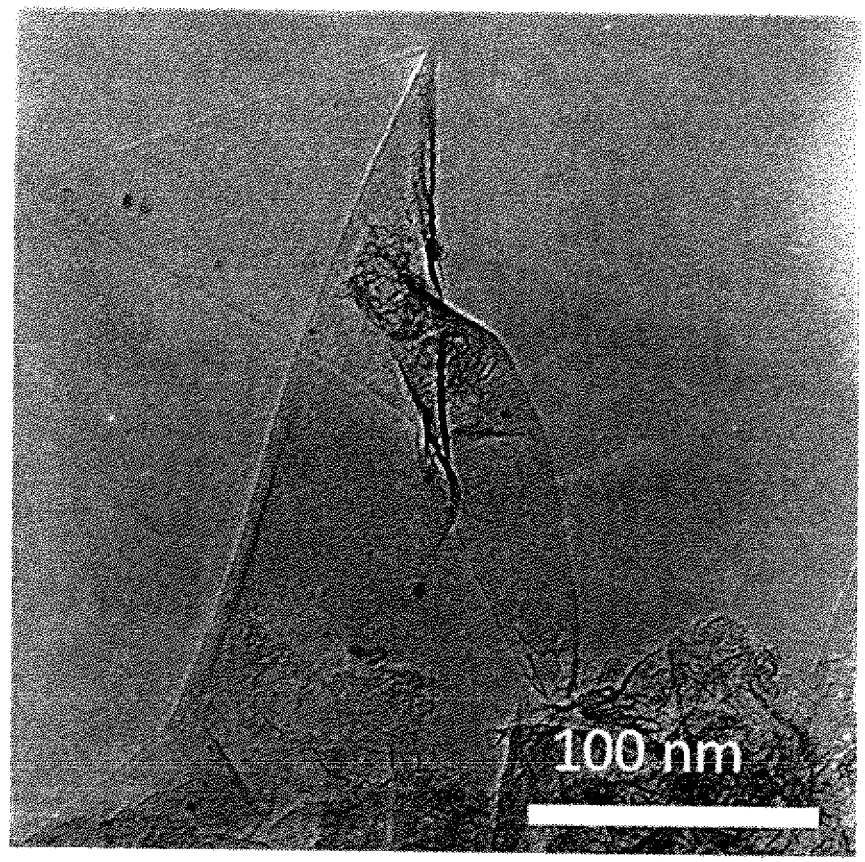
FIG. 10 A transmission electron microscopy image of the sheet-form residue produced from solution 1.

FIG. 3 is a scanning electron microscopy image of the residue present in solution 1 after irradiation with plasma. FIG. 4 is a scanning electron microscopy image of the residue present in solution 2 after irradiation with plasma. FIG. 5 is a scanning electron microscopy image of the residue present in solution 3 after irradiation with plasma. FIG. 6 is a scanning electron microscopy image of the residue present in solution 4 after irradiation with plasma. FIG. 7 is a scanning electron microscopy image of the residue present in solution 5 after irradiation with plasma. FIG. 8 is a scanning electron microscopy image of the residue present in solution 6 after irradiation with plasma. FIG. 9 is a wide-view scanning electron microscopy image of the sheet-form residue formed from solution 1. In the figure, sheet-like fragments were clustered. FIG. 10 is a transmission electron microscopy image of the sheet-form residue produced from solution 1. In the figure, a residue having a form of a bent sheet was observed. As shown in FIG. 10, the residue is a sheet-like matter.

4-3. Raman Shift

Figure 11:
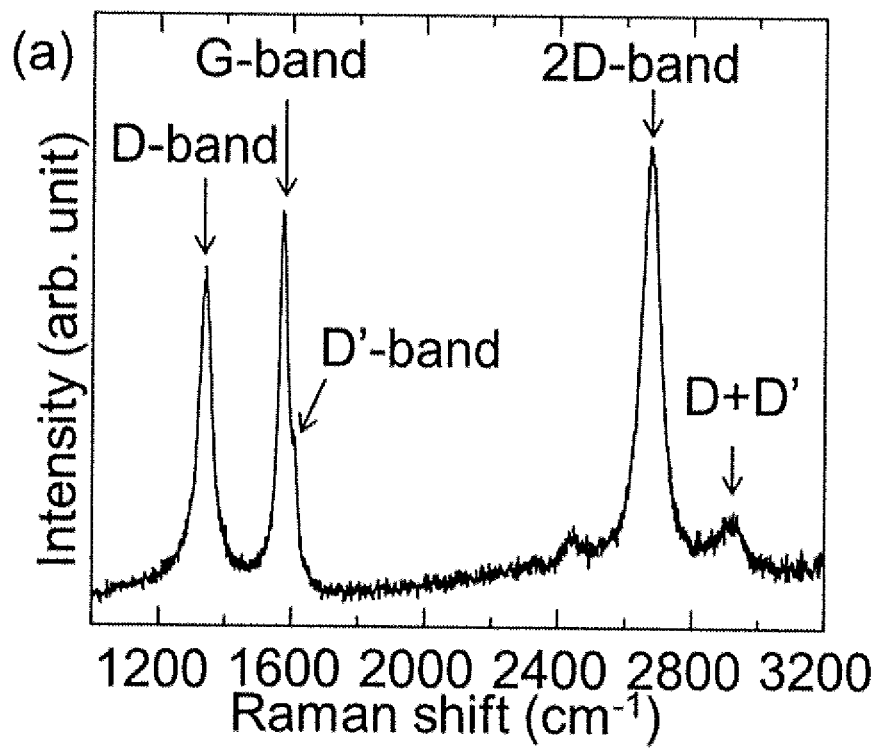
FIG. 11 A graph of a Raman spectrum of the residue present in solution 1 after irradiation with plasma.
Figure 12:
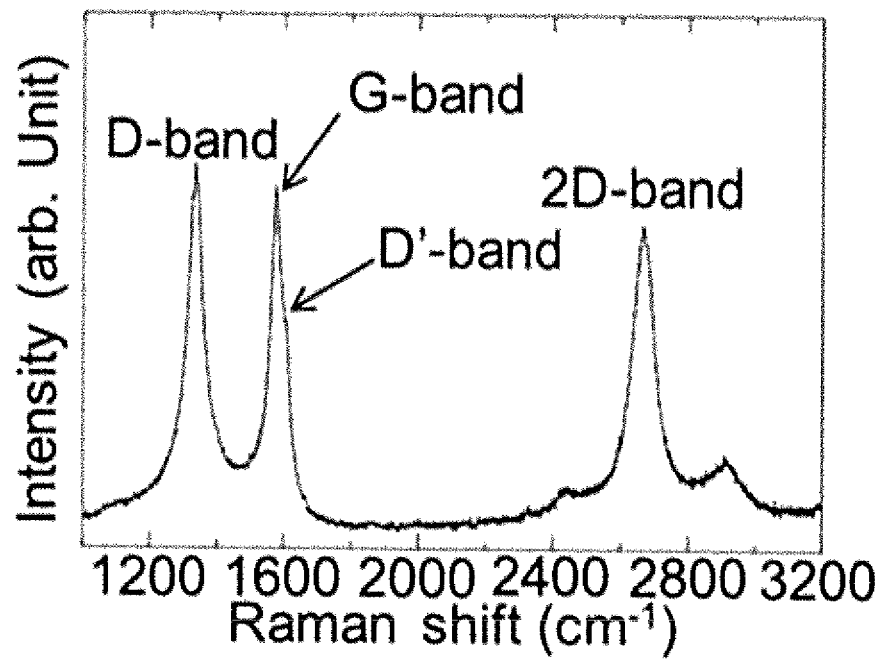
FIG. 12 A graph of a Raman spectrum of the residue present in solution 2 after irradiation with plasma.
Figure 13:
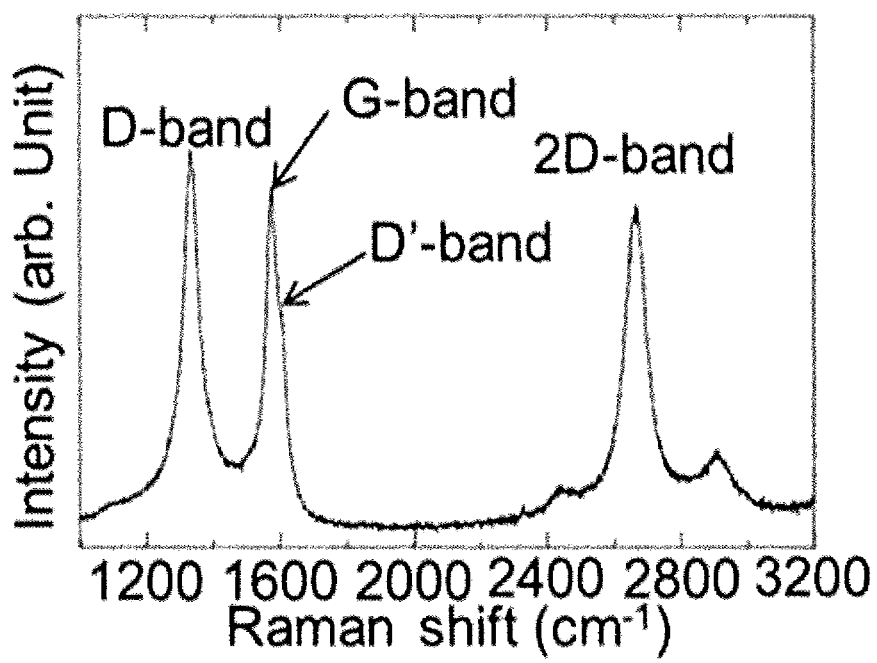
FIG. 13 A graph of a Raman spectrum of the residue present in solution 3 after irradiation with plasma.
Figure 14:
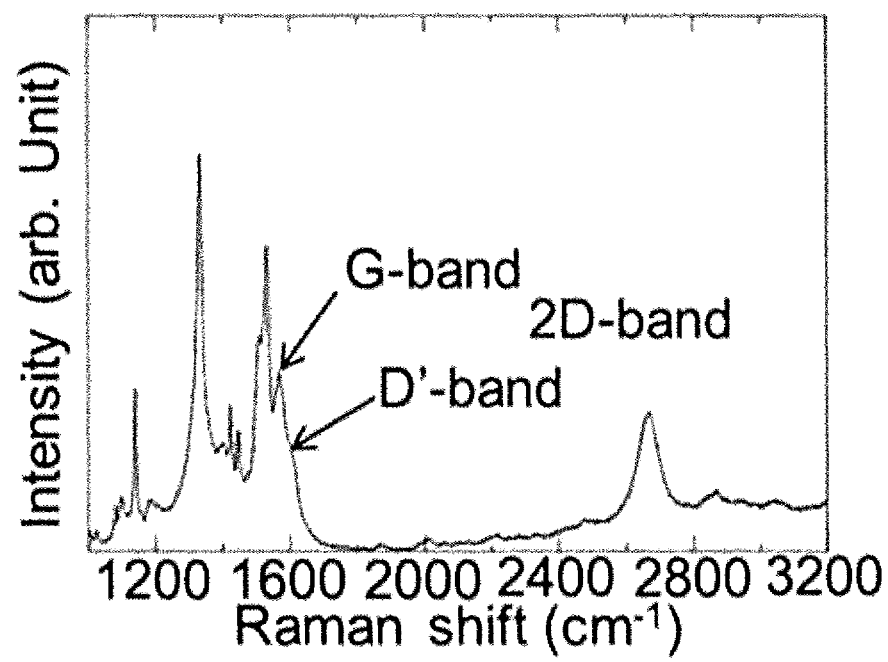
FIG. 14 A graph of a Raman spectrum of the residue present in solution 4 after irradiation with plasma.
Figure 15:
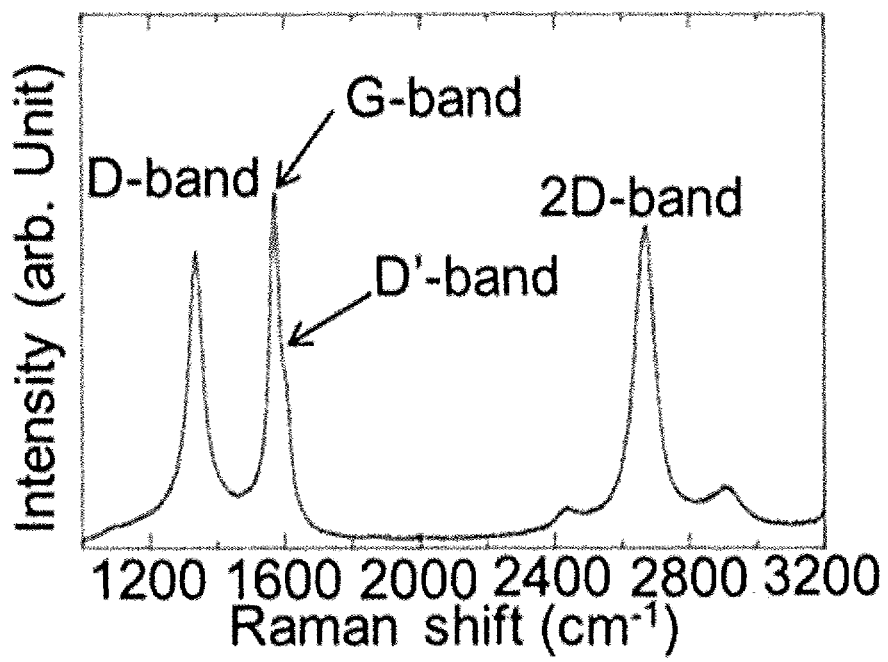
FIG. 15 A graph of a Raman spectrum of the residue present in solution 5 after irradiation with plasma.
Figure 16:
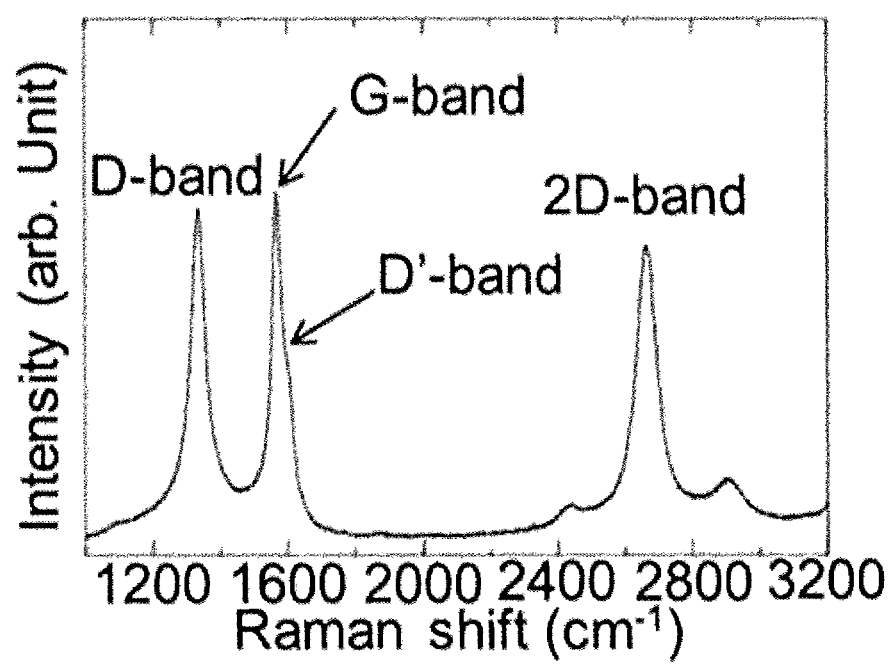
FIG. 16 A graph of a Raman spectrum of the residue present in solution 6 after irradiation with plasma.

FIG. 11 is a graph of a Raman spectrum of the residue present in solution 1 after irradiation with plasma. FIG. 12 is a graph of a Raman spectrum of the residue present in solution 2 after irradiation with plasma. FIG. 13 is a graph of a Raman spectrum of the residue present in solution 3 after irradiation with plasma. FIG. 14 is a graph of a Raman spectrum of the residue present in solution 4 after irradiation with plasma. FIG. 15 is a graph of a Raman spectrum of the residue present in solution 5 after irradiation with plasma. FIG. 16 is a graph of a Raman spectrum of the residue present in solution 6 after irradiation with plasma.

As shown in each of FIGS. 11 to 16, D band (1340 cm$^{-1}$), G band (1580 cm$^{-1}$), D☐ band (1620 cm$^{-1}$), and 2D band (2700 cm$^{-1}$) were observed. There was no substantial difference in Raman shift profile among the Raman spectra of FIGS. 11 to 16. However, the intensity of 2D band in FIG. 14 is lower than the intensities of other bands such as D band. FIGS. 11 to 16 suggest that each residue is formed of a certain carbon material. Thus, the sheet-like residue is thought to be a carbon material structure. That is, the sheet-like residue is thought to be a carbon nanosheet. A residue of non-sheet-like matter is thought to be formed of a carbon nanomaterial other than a carbon nanosheet.

4-4. Plasma-Mediated Products

Figure 17:
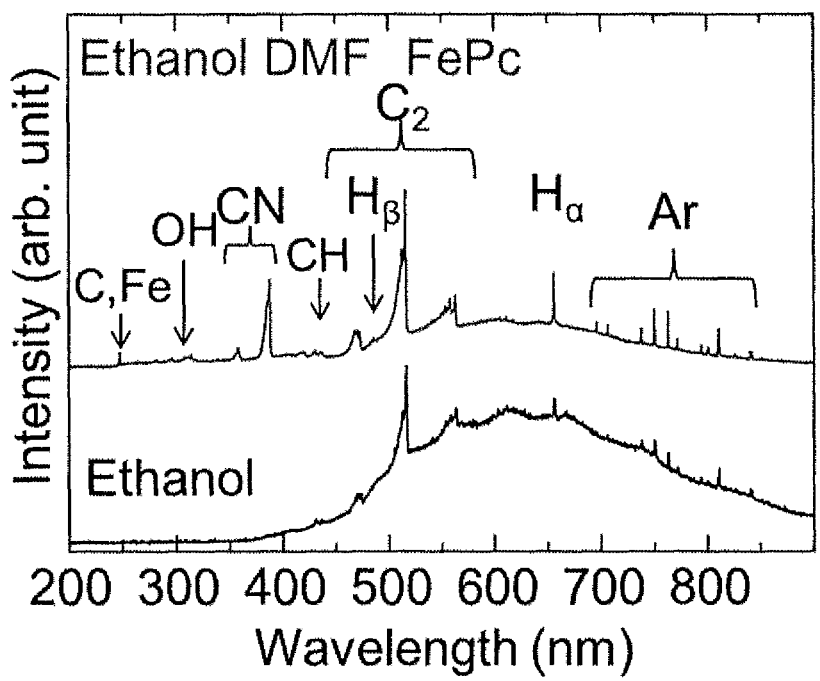
FIG. 17 A graph of an emission spectrum of plasma.

FIG. 17 is a graph of an emission spectra of plasma. As shown in FIG. 17, peaks attributed to Fe or C (250 nm), OH (310 nm), CN (390 nm), CH (430 nm), H (488 nm, 656 nm), and C$_2$ (474 nm, 516 nm, and 564 nm) were observed. At least one of the plasma-mediated products is involved in formation of the carbon nanosheet CS1.

Experiment 2

Next, an application field of the carbon nanosheet was investigated. Specifically, a catalytic property of the carbon nanosheet was evaluated.

1. Oxygen-Reduction Reaction

Oxygen-reduction reaction includes the following two reaction paths:

$$O_2 + 2H^+ + 2e^- \rightarrow H_2O_2 \qquad (1)$$

$$O_2 + 4H^+ + 4e^- \rightarrow 2H_2O \qquad (2).$$

Equation (1) is a 2-electron reaction in which 2 electrons are involved. Equation (2) is a 4-electron reaction in which 4 electrons are involved. From the viewpoint of gaining large current, predominance of 4-electron reaction is preferred in a fuel cell.

2. Apparatus

Figure 18:
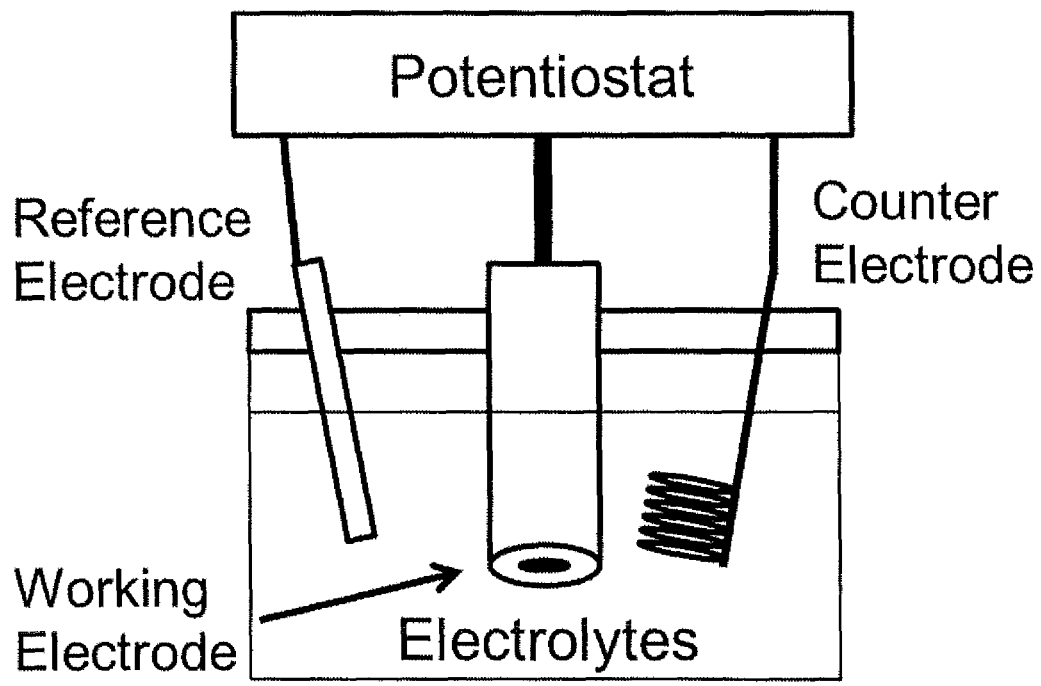
FIG. 18 A schematic configuration of a rotating electrode apparatus.

FIG. 18 is a schematic configuration of a rotating electrode apparatus. The rotating electrode apparatus is operated in hydrodynamic voltammetry (HDV), to thereby determine which of the 2-electron reaction and the 4-electron reaction is predominant. The apparatus includes a container body for accommodating an electrolyte, a working electrode, a counter electrode, a reference electrode, and a potentiostat. The working electrode is a rotating electrode. The potentiostat monitors the potential of the working electrode with respect to the reference electrode, and a current flowing between the working electrode and the counter electrode.

3. Principle of Measurement

Figure 19:
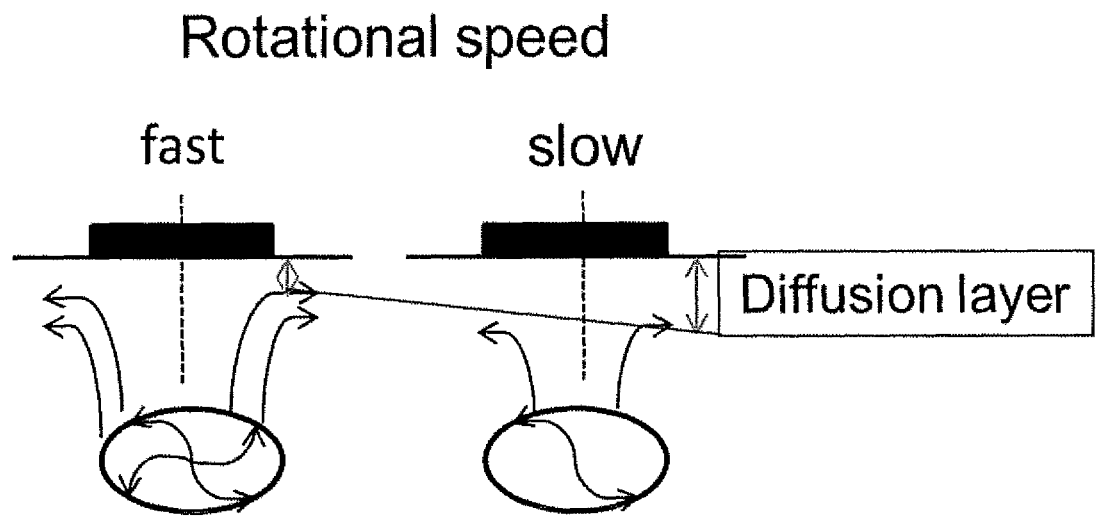
FIG. 19 A schematic diagram conceptually showing the relationship between the rotation rate of the working electrode and the thickness of the diffusion layer in water.

FIG. 19 is a schematic diagram conceptually showing the relationship between the rotation rate of the working electrode and the thickness of the diffusion layer in water. As shown in FIG. 19, the higher the rotation speed of the rotating electrode, the thinner the diffusion layer. In other words, the lower the rotation speed, the thicker the diffusion layer.

Figure 20:
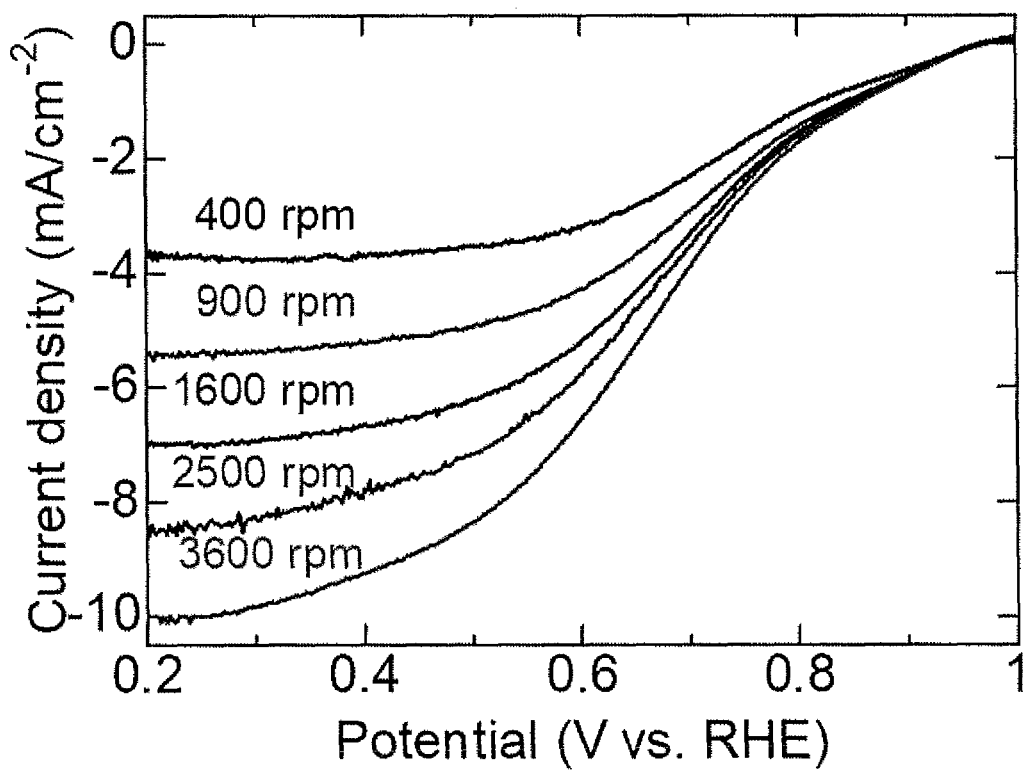
FIG. 20 A graph showing the relationship between the potential of the working electrode and current density.

FIG. 20 is a graph showing the relationship between the potential of the working electrode and the current density. In FIG. 20, the horizontal axis represents the working electrode potential with respect to the reference electrode, and the vertical axis represents the current density of the current flowing between the working electrode and the counter electrode. As is clear from FIG. 20, the higher the rotation speed, the greater the absolute value of current density. In other words, the lower the rotation speed, the smaller the absolute value of current density.

The current density of the diffusion current flowing from the working electrode satisfies the following relationship (Koutecky-Levich formula):

$$(j)^{-1} = (j_k)^{-1} + (B\omega^{1/2})^{-1} \quad (3)$$

$$B = 0.2nFDo^{2/3}\upsilon^{-1/6}Co \quad (4)$$

F: Faraday constant (96,485 C·mol$^{-1}$)
Do: Diffusion coefficient of $O_2$ ($1.9 \times 10^{-5}$ cm$^2$/s)
$\upsilon$: Kinematic viscosity (0.01 cm$^2$/s)
Co: $O_2$ bulk density ($1.2 \times 10^{-6}$ mol·cm$^{-3}$)
n: Number of electrons involved in reaction The number of electrons involved in reaction can be derived from equations (3) and (4).

4. Measurement Conditions

Iron phthalocyanine was used as an iron atom-containing compound. N,N-dimethylformamide (DMF) was used as a solvent. Ethanol or 1-butanol was used as an alcohol.

A working electrode made of glassy carbon and a platinum wire counter electrode were employed. A reference electrode made of an Ag/AgCl electrode was employed in the case of an alkaline medium, and a reversible hydrogen reference electrode was employed in the case of an acidic medium. The alkaline medium was 0.1M KOH, and the acidic medium was 0.1M HClO$_4$. The working electrode was rotated at 400 rpm, 900 rpm, 1,600 rpm, and 2,500 rpm.

5. Results of Measurement

Figure 21:
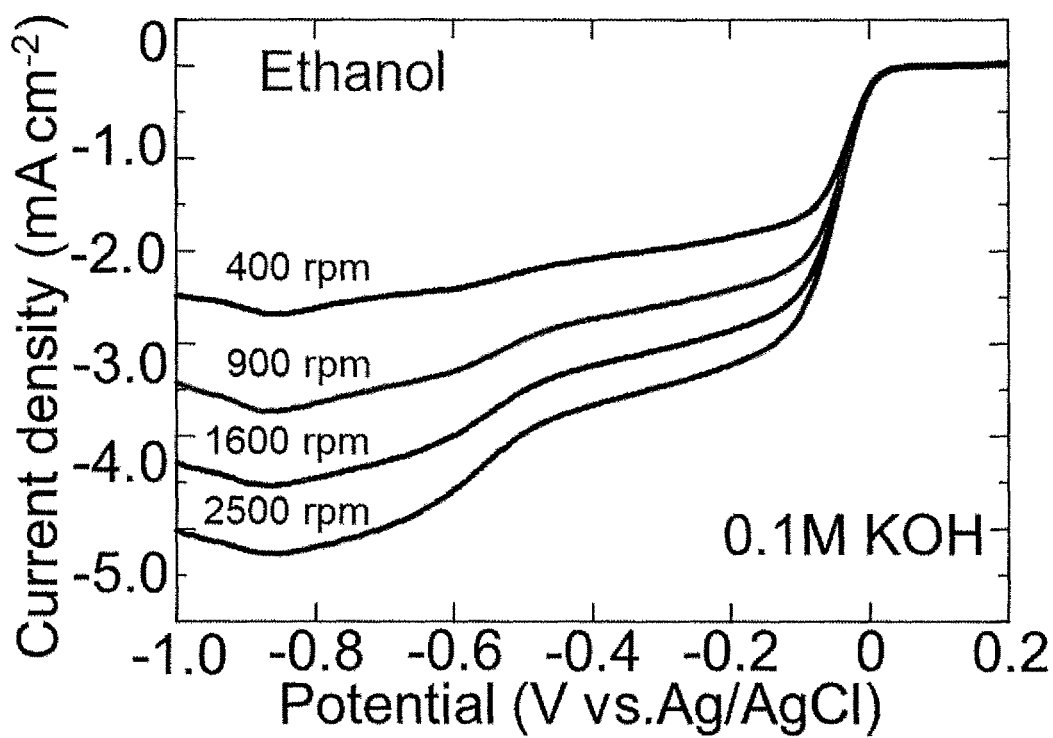
FIG. 21 A graph showing the relationship between the potential of the working electrode and the current density, when ethanol is used as an alcohol.

FIG. 21 is a graph showing the relationship between the potential of the working electrode and the current density, when ethanol is used as the alcohol. In FIG. 20, the horizontal axis represents the potential of the working electrode with respect to the reference electrode in an alkaline medium, and the vertical axis represents the current density of the current flowing between the working electrode and the counter electrode. As shown in FIG. 21, the current density profile varied in response to the rotation rate of the working electrode.

Figure 22:
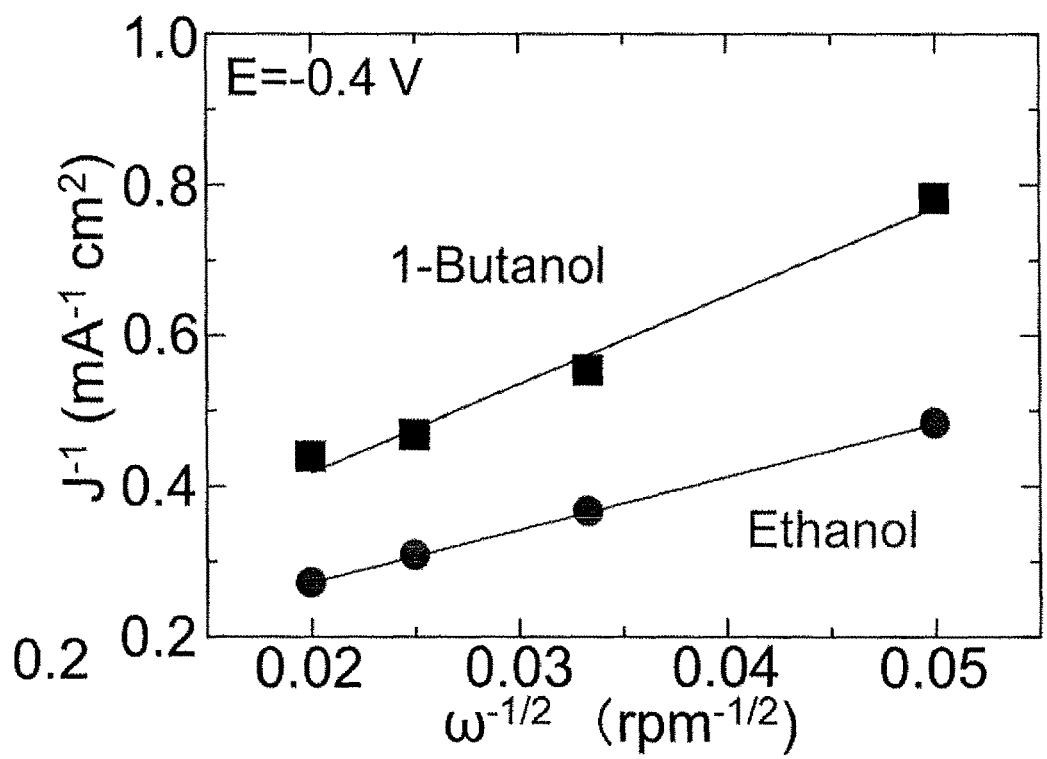
FIG. 22 A graph for determining the number of electrons involved in reaction.

FIG. 22 is a graph for determining the number of electrons involved in reaction. In FIG. 22, the horizontal axis represents the angular speed of the working electrode to the power $-\frac{1}{2}$, and the vertical axis represents the reciprocal of current density. As shown in FIG. 22, the reciprocal of current density was plotted in a linear manner with respect to the horizontal axis both in the cases of ethanol and 1-butanol, indicating that application of equations (3) and (4) was appropriate.

6. Catalytic Property of Carbon Nanosheet

Table 3 shows the number of electrons involved in reaction, when several alcohols were used. As shown in Table 3, when 1-butanol was used, the number of electrons involved in reaction was found to be 2.44, whereas when ethanol was used, the number was found to be 4.06. Thus, when ethanol was used as an alcohol, 4-electron reaction was considerably predominant. In other words, the carbon nanosheet produced with ethanol as an alcohol can serve as an excellent catalyst for fuel cells.

TABLE 3

| Alcohol | No. of electrons in reaction |
| --- | --- |
| ethanol | 4.06 |
| 1-butanol | 2.44 |

INDUSTRIAL APPLICABILITY

The carbon nanosheet having the aforementioned characteristics is used as, for example, a catalyst for fuel cells. Also, the carbon nanosheet may possibly be employed as an electrode in a lithium ion secondary battery or in a polymer electrolyte fuel cell.

ADDITIONAL REMARKS

The carbon nanosheet production method according to the first aspect comprises a step of mixing a solution of an iron atom-containing compound dispersed in a solvent with an alcohol, to thereby prepare a solution mixture; and a step of irradiating the solution mixture with plasma, to thereby produce a carbon nanosheet.

In the carbon nanosheet production method according to a second aspect, the step of irradiating the solution mixture with plasma employs a first electrode in a gas phase and a second electrode in the solution mixture. Through application of a voltage between the first electrode and the second electrode, electric discharge is caused to occur at the gas-liquid interface.

In the carbon nanosheet production method according to a third aspect, in the step of irradiating the solution mixture with plasma, electric discharge is caused to occur between an end portion of the first electrode and a lateral surface of the second electrode.

In the carbon nanosheet production method according to a fourth aspect, at least one of the first electrode and the second electrode is made of a carbon material.

In the carbon nanosheet production method according to a fifth aspect, in the step of irradiating the solution mixture with plasma, CN radicals are generated.

In the carbon nanosheet production method according to a sixth aspect, in the step of irradiating the solution mixture with plasma, a container for accommodating the solution mixture is employed. While the interior of the container is purged with noble gas, the solution mixture is irradiated with plasma.

In the carbon nanosheet production method according to a seventh aspect, the iron atom-containing compound is an organic compound.

In the carbon nanosheet production method according to an eighth aspect, the organic compound has a metal-nitrogen bond but no metal-carbon bond.

In the carbon nanosheet production method according to a ninth aspect, the alcohol is ethanol.

In the carbon nanosheet production method according to a tenth aspect, the solvent is an organic solvent.

In the carbon nanosheet production method according to an eleventh aspect, in the step of irradiating the solution mixture with plasma, the solution mixture is irradiated with plasma at a plasma density of $3 \times 10^{14}$ cm$^{-3}$ to $7 \times 10^{14}$ cm$^{-3}$.

In the carbon nanosheet production method according to a twelfth aspect, the carbon nanosheet has a side having a length of 0.5 µm to 2.5 µm.

The carbon nanosheet according to a thirteenth aspect has a sheet form. The sheet has a side having a length of 0.5 μm to 2.5 μm and a thickness of 0.7 nm to 10 nm.

In the carbon nanosheet according to a fourteenth aspect, a plurality of carbon nanosheets are clustered.

The carbon nanosheet according to a fifteenth aspect contains an iron atom.

DESCRIPTION OF THE REFERENCE NUMERALS

CS1 . . . carbon nanosheet
100 . . . plasma generator
110 . . . first electrode structure
111 . . . first electrode
111a . . . end portion
112 . . . electrically insulating member
120 . . . second electrode structure
121 . . . second electrode
121a . . . lateral surface
122 . . . electrically conductive member
123 . . . electrically insulating member
130 . . . voltage-applying unit
140 . . . container
141 . . . container body
142 . . . lid
151 . . . gas supply inlet
152 . . . gas discharge outlet

The invention claimed is:

1. A method for producing a carbon nanosheet, comprising
    mixing a solution of an iron atom-containing compound dispersed in a solvent with an alcohol, to thereby prepare a solution mixture; and
    irradiating the solution mixture with plasma, to thereby produce a carbon nanosheet.

2. A carbon nanosheet production method according to claim 1, wherein
    irradiating the solution mixture with plasma employs a first electrode in a gas phase and a second electrode in the solution mixture, and
    electric discharge is caused to occur at the gas-liquid interface through application of a voltage between the first electrode and the second electrode.

3. A carbon nanosheet production method according to claim 1, wherein,
    irradiation the solution mixture with plasma, electric discharge is caused to occur between an end portion of the first electrode and a lateral surface of the second electrode.

4. A carbon nanosheet production method according to claim 2, wherein at least one of the first electrode and the second electrode is made of a carbon material.

5. A carbon nanosheet production method according to claim 1, wherein, irradiation the solution mixture with plasma, CN radicals are generated.

6. A carbon nanosheet production method according to claim 1, wherein, irradiation the solution mixture with plasma,
    a container for accommodating the solution mixture is employed, and
    the solution mixture is irradiated with plasma, while the interior of the container is purged with noble gas.

7. A carbon nanosheet production method according to claim 1, wherein the iron atom-containing compound is an organic compound.

8. A carbon nanosheet production method according to claim 7, wherein the organic compound has a metal-nitrogen bond but no metal-carbon bond.

9. A carbon nanosheet production method according to claim 1, wherein the alcohol is ethanol.

10. A carbon nanosheet production method according to claim 1, wherein the solvent is an organic solvent.

11. A carbon nanosheet production method according to claim 1, wherein, the solution mixture is irradiated with plasma at a plasma density of $3 \times 10^{14}$ cm$^{-3}$ to $7 \times 10^{14}$ cm$^{-3}$.

12. A carbon nanosheet production method according to claim 1, wherein the carbon nanosheet has a side having a length of 0.5 μm to 2.5 μm.

* * * * *